US007015714B2

(12) United States Patent
Pan et al.

(10) Patent No.: US 7,015,714 B2
(45) Date of Patent: Mar. 21, 2006

(54) TESTING DEVICE FOR PRINTED CIRCUIT BOARDS

(75) Inventors: Wen-Jun Pan, Shenzhen (CN); Su-Shun Zhang, Shenzhen (CN)

(73) Assignee: Hon Hai Precision Industry Co., Ltd., (TW)

( * ) Notice: Subject to any disclaimer, the term of this patent is extended or adjusted under 35 U.S.C. 154(b) by 0 days.

(21) Appl. No.: 11/048,242

(22) Filed: Feb. 1, 2005

(65) Prior Publication Data

US 2005/0184750 A1 Aug. 25, 2005

(30) Foreign Application Priority Data

Feb. 21, 2004 (CN) ...................... 200410015457 A

(51) Int. Cl.
*G01R 31/02* (2006.01)

(52) U.S. Cl. ...................... 324/763; 324/754; 324/761; 324/73.1

(58) Field of Classification Search ..................... None
See application file for complete search history.

(56) References Cited

U.S. PATENT DOCUMENTS

| | | | | |
|---|---|---|---|---|
| 4,724,377 | A * | 2/1988 | Maelzer et al. | 324/149 |
| 5,418,470 | A * | 5/1995 | Dagostino et al. | 324/763 |
| 5,502,397 | A * | 3/1996 | Buchanan | 324/754 |

FOREIGN PATENT DOCUMENTS

| | | |
|---|---|---|
| TW | 462496 | 11/2001 |

* cited by examiner

*Primary Examiner*—Minh N. Tang
(74) *Attorney, Agent, or Firm*—Morris, Manning & Martin, LLP; Tim Tingkang Xia, Esq

(57) ABSTRACT

A testing device for testing a printed circuit board comprises a testing signal converting module which comprises a connector for receiving testing signals from the printed circuit board and a converting circuit for converting the testing signals to compatible signals, the converting circuit is coupled to the connector. A testing circuit receives compatible signals from the testing signal converting module.

22 Claims, 5 Drawing Sheets

TESTING DEVICE FOR PRINTED CIRCUIT BOARDS

BACKGROUND OF THE INVENTION

1. Field of the Invention

The present invention relates to a testing device for printed circuit boards, particularly to a testing device for testing overall functions of printed circuit boards.

2. Description of the Related Art

After assembling a printed circuit board, it must have an overall test on the functions to insure the qualities are good. The test mainly aims at the errors that probably occur during the assembling process of the printed circuit board, such as open circuit, short circuit as well as the incorrect connection between the chips. After these detections, the error signals from the testing device are analyzed to find out where the error points are on the circuit board.

In one conventional arrangement, an untested printed circuit board is connected to a testing board with a plurality of terminals by manual work, then outputs the testing signals from the footprints of the chips and slots. Then the testing signals are inputted to different testing device for testing different chips and slots respectively. However, there are so many elements on the printed circuit board, it is time-consuming to connect the footprints of the chips and slots with the terminals one by one by the operators, and it is labor-consuming and prone to misoperation.

Something has been done to improve the testing module. A new approach has been disclosed in the Taiwan Patent No. 462496. The testing device for CPU (computer processor unit) detection comprises a transfer board and a plurality of probes. The transfer board is coupled to a CPU of the printed circuit board and enlarges a clock circuit of the CPU with a clock enlarged circuit. The probes are arranged in the transfer board and electronically connect with the transfer board as well as the footprint of the printed circuit board. However the testing device for CPU detection is only capable of the CPU testing, while the tests on the audio, the battery are ignored or have to be tested in another testing device. The unqualified audio elements and the unqualified battery bring a lot of inconvenience to the users and the respective testing is labor-consuming and lead to low work efficiency.

Thus, an improved testing device for the printed circuit board which overcomes the above-mentioned problems is desired.

BRIEF SUMMARY OF THE INVENTION

Accordingly, an object of the present invention is to provide a testing device for an overall detection on an untested printed circuit board.

To achieve the above object, a testing device for testing a printed circuit board on line comprises a testing signal converting module, a VGA-AGP(Video Graphic Array-Accelerated Graphics Port) switching circuit, a front panel testing circuit, an audio testing circuit and a battery testing circuit. The testing signal converting module comprises a computer connector for receiving untested signals and a signal converting circuit coupled to the computer connector. The VGA-AGP switching circuit switches a VGA test to an AGP test via an auto-switching circuit. The front panel testing circuit detects the type of chassis ID, the state of HDD (Hard Disk Drive) LED as well as power LED. The audio testing circuit comprises at least one system signal receiving from the testing signal converting module. The battery testing circuit compares the value of the untested printed circuit board battery with a normal value and comprises a control circuit of battery normal voltage and a comparator circuit coupled to the control circuit of battery normal voltage. When testing, the testing signal converting module transfers the untested signals into compatible signals for the test system and outputs these signals to the VGA-AGP switching circuit, the front panel testing circuit, the audio testing circuit and the battery testing circuit.

A principal advantage of this embodiment is that the testing device can have an overall test on the untested printed circuit board easily and quickly.

Other objects, advantages and novel features of the present invention will become more apparent from the following detailed description when taken in conjunction with the accompanying drawings, in which:

DETAILED DESCRIPTION OF THE INVENTION

Figure 1:
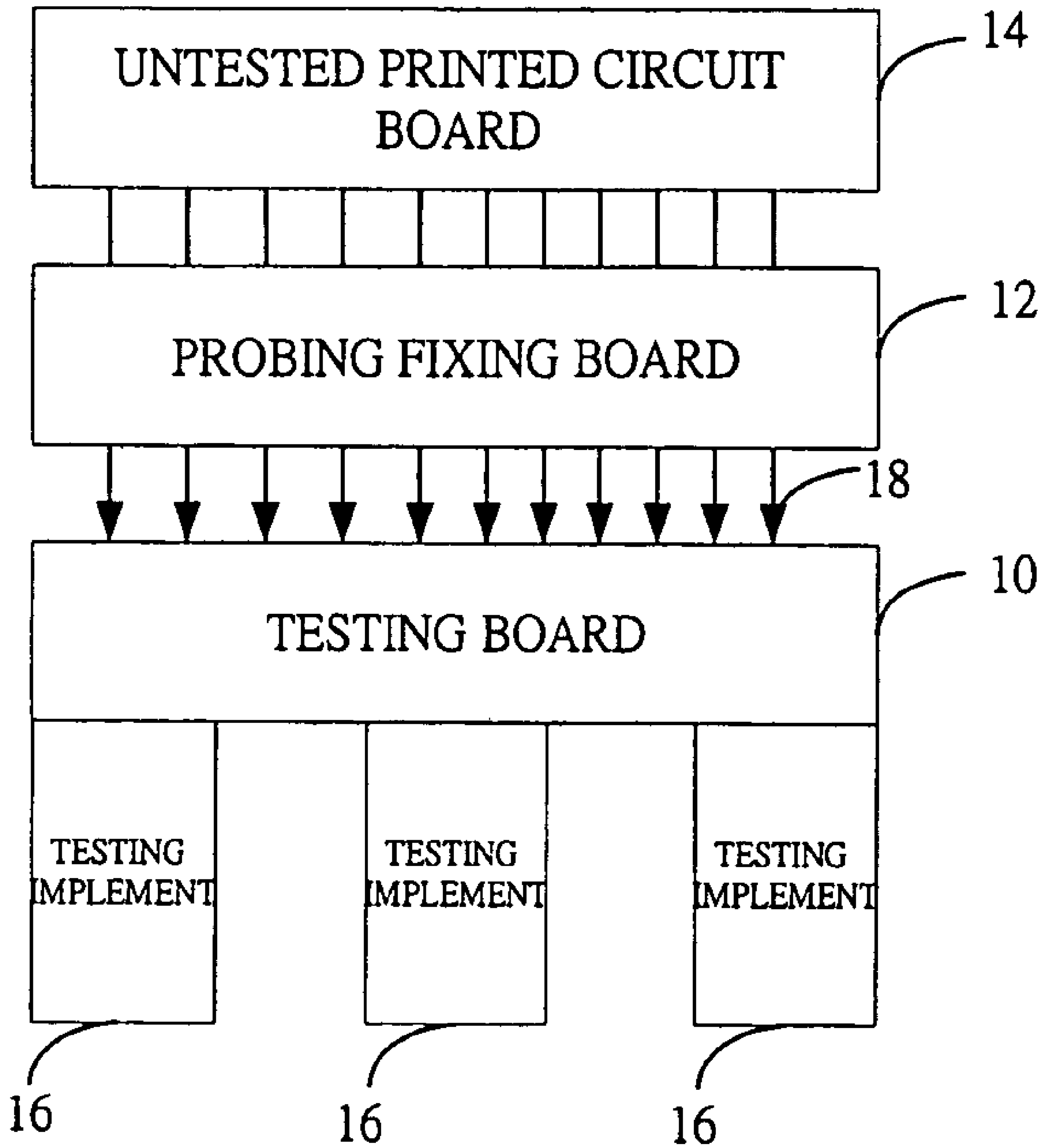
FIG. 1 is a decomposed view of a testing device of the present invention.

Referring to FIG. 1, a testing device for printed circuit boards is capable of detecting all kinds of functions of an untested printed circuit board 14 and outputting testing signals via a probing fixing board 12. The probing fixing board 12 comprises a plurality of probes 18. When testing, the probing fixing board 12 is put between the untested printed circuit board 14 and the testing board 10, and outputs the testing signals from the untested printed circuit board 14 to the testing board 10 via the probes 18. These testing signals are transferred to a plurality of testing implements 16 by the testing board 10. The testing implements 16, such as displays, instruments, analyze the testing signals and show the states as well as the results thereof.

Figure 2:
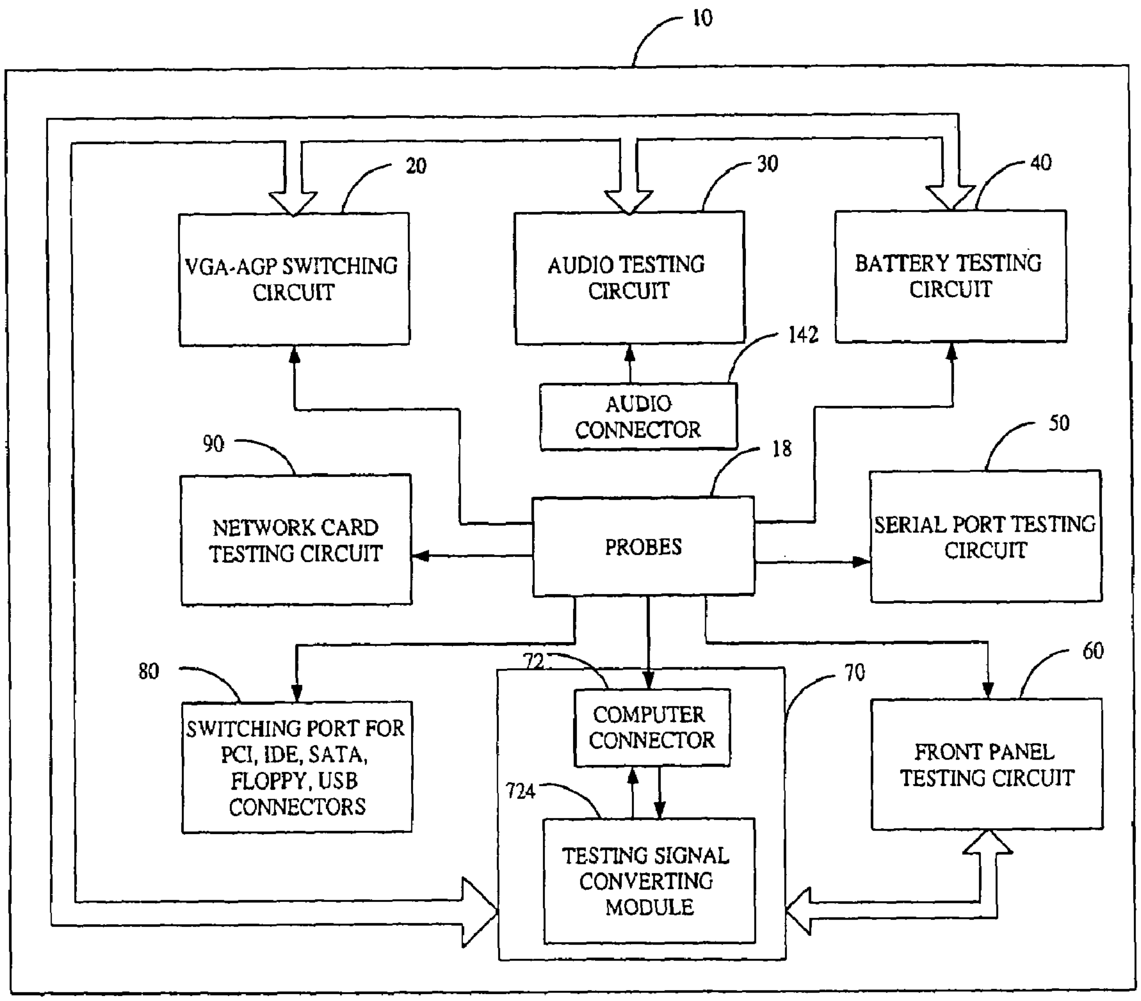
FIG. 2 illustrates a block diagram showing the structure of a testing board of FIG. 1.

Referring to FIG. 2, the testing board 10 comprises a VGA-AGP(Video Graphic Array-Accelerated Graphics Port) switching circuit 20, an audio testing circuit 30, a battery testing circuit 40, a serial port testing circuit 50, a front panel testing circuit 60, a testing signal converting module 70, a switching port 80 for PCI (Peripheral Component Interface), IDE (Integrated Drive Electronics), SATA (Serial Advanced Technology Electronics), Floppy, USB (Universal Serial Bus) connectors, and a network card testing circuit 90. The VGA-AGP switching circuit 20, the battery testing circuit 40, the serial port testing circuit 50, the front panel testing circuit 60, the switching port 80 and the network card testing circuit 90 as well as the testing signal converting module 70 receive testing signals from the probes 18 on the probing fixing board 12, while the audio testing circuit 30 receives testing signals from an audio connector 142 on the untested printed circuit board 14. The serial port testing circuit 50 and the switching port 80 for PCI, IDE, SATA, Floppy, USB connectors are mainly used for testing the functions of a plurality of the computer ports of the untested printed circuit board 14. The network card testing circuit 90 is capable of insuring the quality of a network card. The testing signal converting module 70 mainly comprises two parts: a computer connector 72 and a signal converting circuit 724. The signal converting circuit 724 is capable of converting the untested signals, such as CPLD (Complex Programmable Logic Device) signals, into the compatible signals for the test system, then these signals are input as system testing signals to the VGA-AGP switching circuit 20, the audio testing circuit 30, the battery testing circuit 40 and the front panel testing circuit 60.

Figure 3:
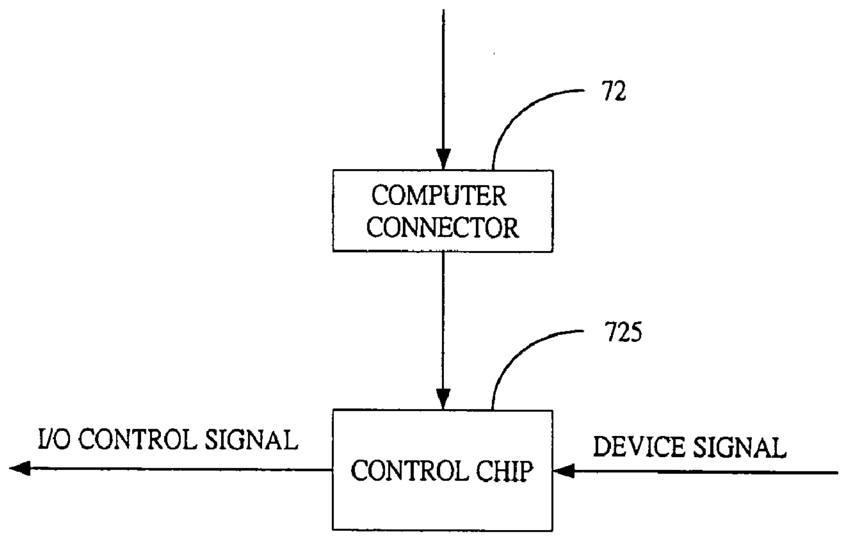
FIG. 3 illustrates a block diagram of a testing signal converting module of FIG. 2.

Referring to FIG. 3, the testing signal converting module 70 comprises a computer port 72 and a control chip 725. The computer port 72 receives signals from the probes 18 and inputs these signals to the control chip 725, and then the signals are switched into an I/O control signal. Meanwhile, the control chip 725 receives a device signal which insures the correct output state of the control chip 725. In the embodiment of the invention to realize the function to convert the untested signals, the computer port 72 can be an IDE1 connector or a printer port or any other ports which can receive certain signals in the computer.

Figure 4:
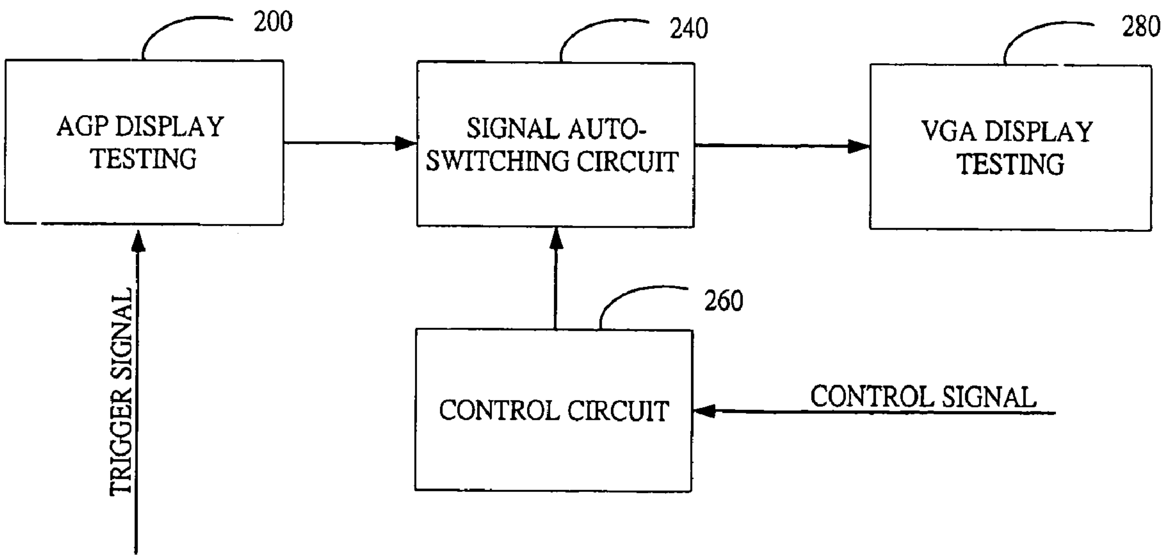
FIG. 4 illustrates a block diagram of a VGA-AGP switching circuit of FIG. 2.

FIG. 4 illustrates a block diagram of the VGA-AGP switching circuit 20. The VGA-AGP switching circuit 20 comprises an AGP display test 200, a signal auto-switching circuit 240, a control circuit 260 and a VGA display test 280. An AGP-RST trigger signal determines the priority of display test and the trigger signal is inputted into the VGA display test 200. If the AGP-RST trigger signal is in high voltage level, it is the turn for AGP display test 200 to work; if the AGP-RST trigger signal is in low voltage level, the VGA display test 280 is valid. The default value of the AGP-RST trigger signal is high voltage level when the circuit is electrified, the AGP display test 200 is forbidden to work when a video card is integrated on the untested printed circuit board 14, then the AGP-RST trigger signal is converted into low voltage level. If there is no video card integrated on the untested printed circuit board 14, the AGP display test 200 has a test on the AGP slots (not shown), the AGP-RST trigger signal is converted into low voltage level after testing and the AGP display test 200 is forbidden to work. Simultaneously, a control signal converted by the signal converting circuit 724 already is inputted into the control circuit 260, the control circuit 260 begins to work. The control circuit 260 is coupled to the signal auto-switching circuit 240 and enables the signal auto-switching circuit 240. Then the signal auto-switching circuit 240 converts the AGP display test 200 to VGA display test 280, the VGA display test 280 is valid.

Figure 5:
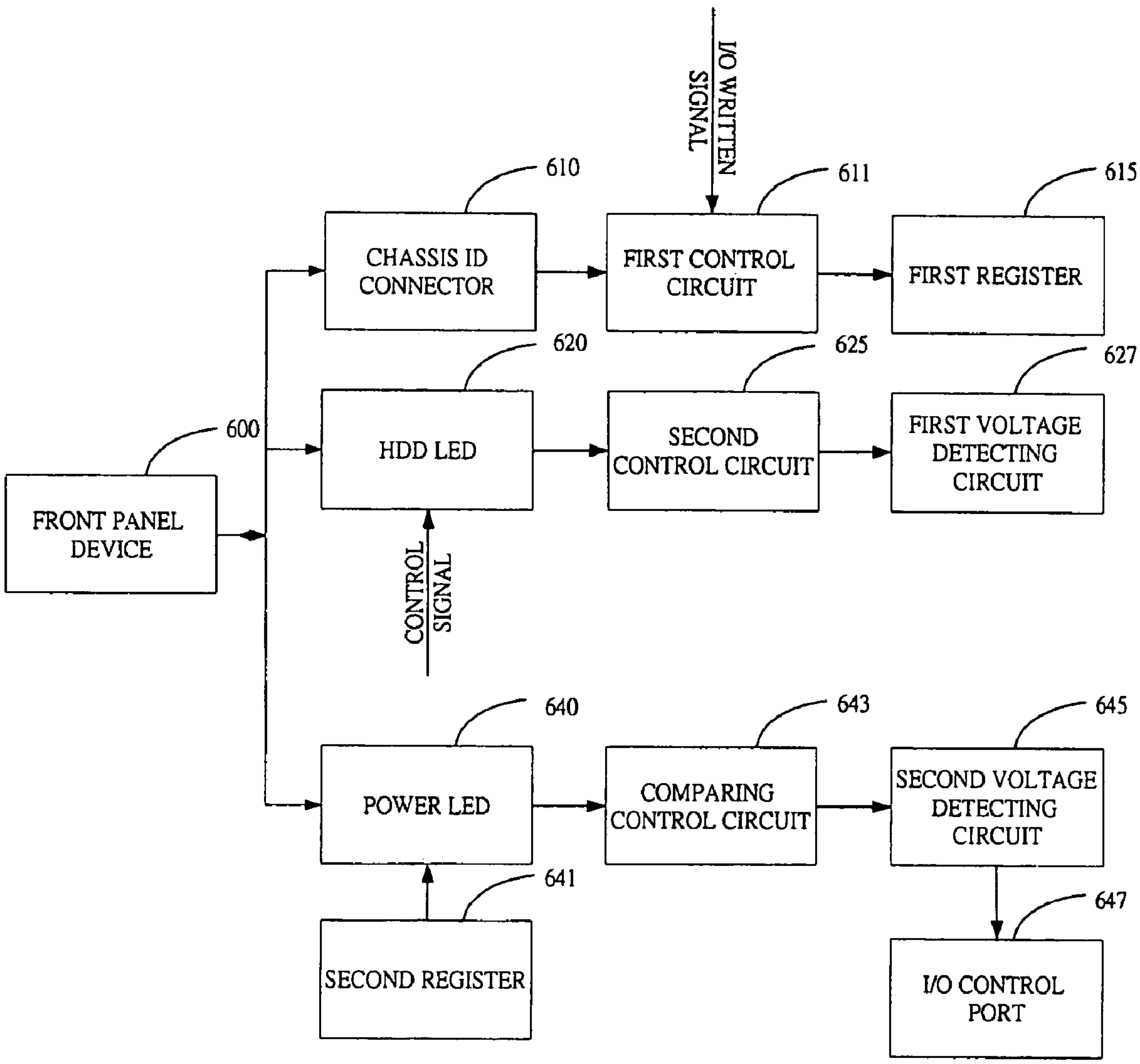
FIG. 5 illustrates a block diagram of a front panel testing circuit of FIG. 2.

Referring to FIG. 5, the front panel testing circuit 60 has a test on chassis ID (Identification), HDD (Hard Driver Device) LED (Low Emitting Diode) and power LED. The front panel testing circuit 60 comprises a front panel device 600 for showing the corresponding testing results, the front panel device 600 is coupled to a chassis ID connector 610, a HDD LED 620 and a power LED 640. The chassis ID connector 610 is capable of collecting the type of the untested printed circuit board 14 and inputting the information to a first control circuit 611. The first control circuit 611 is enabled via an I/O written signal from the testing signal converting module 70. The I/O written signal is valid when it is in low voltage level. The first control circuit 611 is coupled to a first register 615. The first control circuit 611 receives the information on the printed circuit board as well as its matching chassis, which is stored in the first register 615, then the type of the matching chassis to the untested printed circuit board 14 is outputted on an monitor (not shown). The HDD LED 260 is coupled to a second control circuit 625 and enabled via a control signal. The control signal receives signals from the testing signal converting module 70. The HDD LED 620 is enabled via the control signal. Then the HDD LED 620 outputs the signal to the second control circuit 625. The second control circuit 625 converts the signal to a first voltage detecting circuit 627 and the first voltage detecting circuit 627 is coupled to the second control circuit 625. The voltage detecting circuit 627 is valid when it is in low voltage level. The power LED 640 is coupled to a second register 641 and a comparing control circuit 643. The Power LED 640 is enabled via the second register 641. The second register 641 receives input data from the testing signal converting module 70 and outputs the data to the comparing control circuit 643 via the power LED 640. The comparing control circuit 643 outputs the data to a second voltage detecting circuit 645 after processing. Then the voltage level state is outputted to an I/O control port 647. The second voltage detecting circuit 645 is valid when it is in low voltage level.

Figure 6:
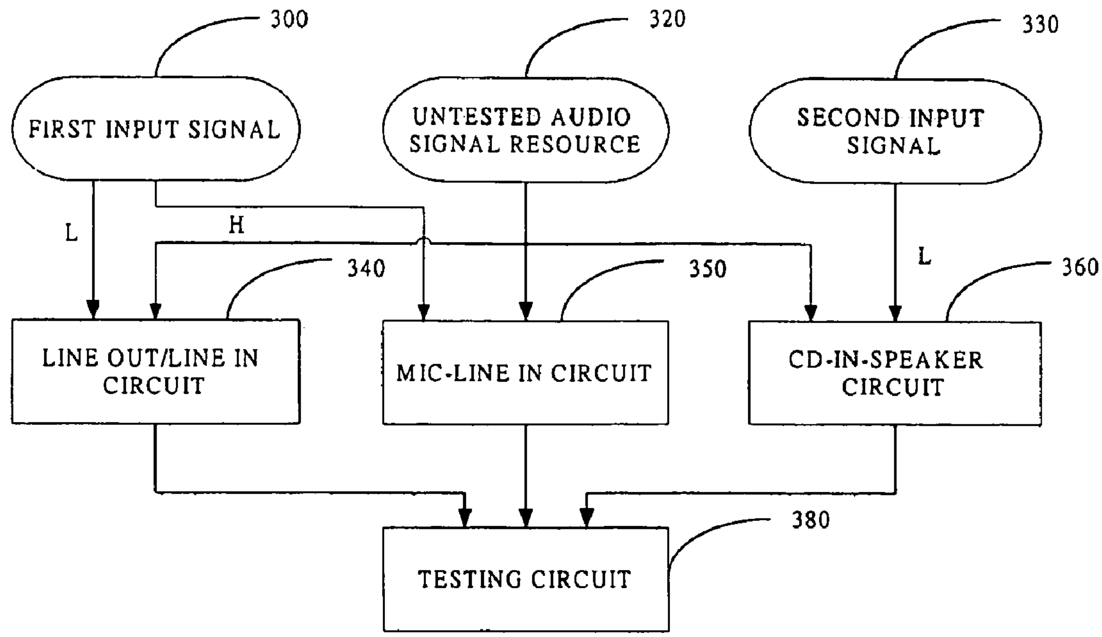
FIG. 6 illustrates a block diagram of an audio testing circuit of FIG. 2.

Referring to FIG. 6, it illustrates a block diagram of the audio testing circuit 30. The audio testing circuit 30 comprises an untested audio signal resource 320, a line out/line in circuit 340, a mic-line (microphone-line) in circuit 350 and a cd-in-speaker (compact disk-in-speaker) circuit 360. A first input signal 300 and a second input signal 330 are received in input port of the audio testing circuit 30. The first input signal 300 and the second input signal 330 come from the testing signal converting module 70. The first input signal 300 is inputted into the line out/line in circuit 340 and the mic-line in circuit 350. The untested audio signal resource 320 is coupled to the line out/line out circuit 340, the mic-line in circuit 350 and the cd-in-speaker circuit 360, respectively. The second input signal 330 is outputted to the cd-in-speaker circuit 360. The line out/line in circuit 340 is also coupled to the cd-in-speaker circuit 360. All of the line out/line in circuit 340,the mic-line in circuit 350 and the cd-in-speaker circuit 360 are coupled to a testing circuit 380. The line out/line in circuit 340 is enabled when the first input signal 300 is in low voltage level, and the line out/line in circuit 340 has a test on audio quality of a headphone of a computer. The mic-line in circuit 350 is enabled when the first input signal 300 is in high voltage level, and the mic-line in circuit 350 has a test on the audio quality of a microphone of the computer. However, when the second input signal 330 is in low voltage level, no matter what the state the first input signal 300 is in, the second input signal 330 is processed prior to the first input signal 300. The cd-in-speaker circuit 360 is enabled when the second input signal 330 is in low voltage level. The normal state of the second input signal 330 is low voltage level, the cd-in-speaker circuit 360 outputs the testing signal to the testing circuit 380. The state of the second input signal 330 is changed into high voltage level after testing and the first input signal 300 is set in high voltage level. The mic-line in circuit 350 outputs the testing signal to the testing circuit 380. The first input signal 300 is changed into low voltage level and the line out/line in circuit 340 outputs the testing signal to the testing circuit 380.

Figure 7:
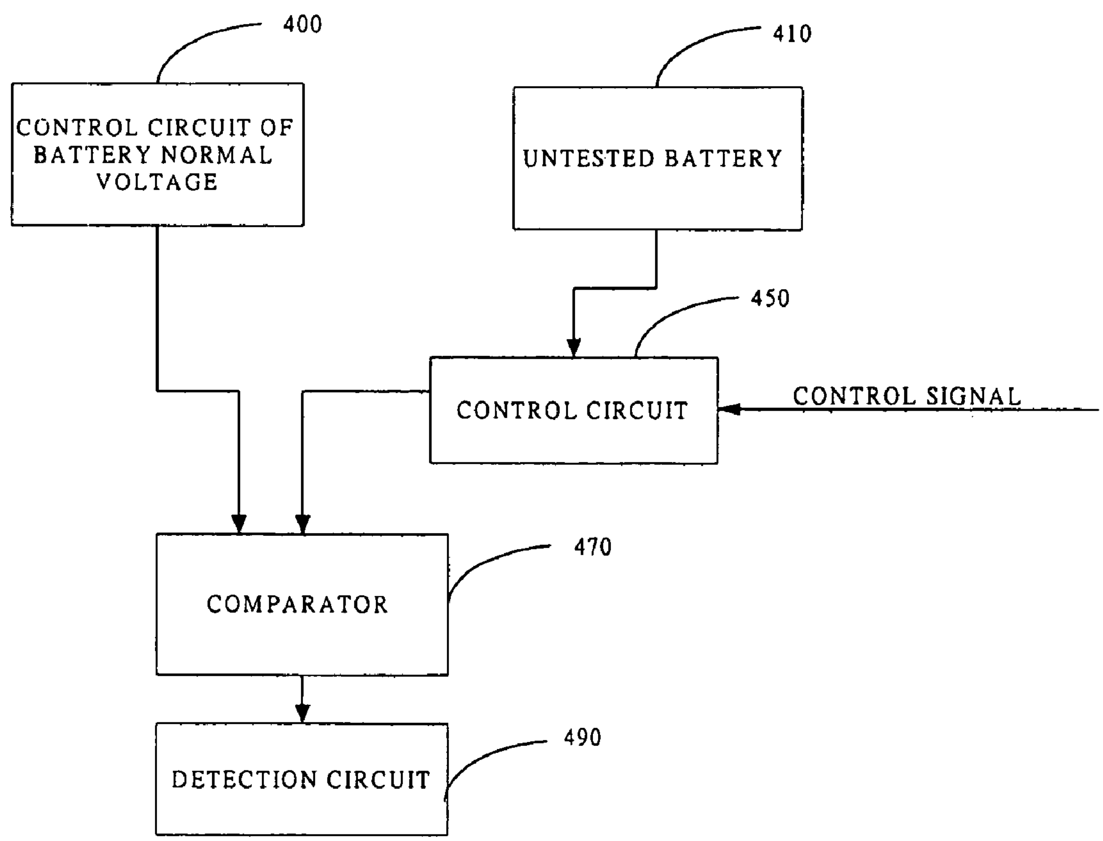
FIG. 7 illustrates a block diagram of a battery testing circuit of FIG. 2.

FIG. 7 illustrates the block diagram of the battery testing circuit 40. The battery testing circuit 40 is capable of picking out the unqualified productions by comparing the voltage value of a battery of the untested printed circuit board to a normal one. The battery testing circuit 40 comprises a control circuit 400 for battery normal voltage, an untested battery 410, a control circuit 450, a comparator 470 and a detection circuit 490. The control circuit 400 for battery normal voltage is coupled to the comparator 470. The control circuit 450 is coupled to the untested battery 410 and the comparator 470, respectively. The comparator 470 is coupled to the detection circuit 490. A control signal 430 receives testing signal from the testing signal converting module 70 and inputs the signal to the control circuit 450. The control signal 430 is valid when it is in low voltage level. The control circuit 450 is enabled via the control signal 430. The control circuit 450 outputs the data collected from the untested battery 410 to the comparator 470. The comparator 470 outputs the result to the detection circuit 490 after comparing the data with the normal value received from the control circuit 400 for battery normal voltage. The output of the detection circuit 490 is in low voltage level when the battery passes the test; the output of the detection circuit 490 is in high voltage level when the battery fails to pass the test.

It is to be understood, however, that even though numerous characteristics and advantages of the present invention have been set forth in the foregoing description, together with details of the structure and function of the invention, the disclosure is illustrative only, and changes may be made in detail, especially in matters of type, arrangement of components within the principles of the invention to the full extent indicated by general meaning of the terms in which the appended claims are expressed.

What is claimed is:

1. A testing device for testing a printed circuit board comprising:

a testing signal converting module comprising a computer connector for receiving testing signals, and a converting circuit coupled to the connector;

a switching circuit comprising a VGA (Video Graphic Array) display test, an AGP (Accelerated Graphics Port) display test and an auto-switching circuit, the auto-switching circuit switching the VGA display test to the AGP display test;

a first testing circuit for detecting chassis ID (Identification), the state of HDD (Hard Disk Driver) LED (Low Emitting Diode) as well as power LED;

a second testing circuit for testing audio quality, the second testing circuit comprising a line out/line in circuit for a headphone test, a mic-line (microphone-line) in circuit for a microphone test and a cd-in-speaker (compact disk-in-speaker) circuit for a cd-speaker test; and a third testing circuit for comparing a voltage of a battery of the printed circuit board with a normal voltage, the third testing circuit comprising a control circuit of battery normal voltage and a comparator coupled to the control circuit of battery normal voltage;

wherein the testing signal converting module converts the testing signals into compatible signals and outputs the compatible signals to the switching circuit, the first testing circuit, the second testing circuit and the third testing circuit, respectively.

2. The testing device as claimed in claim 1, wherein the converting circuit comprises a control chip for converting device signal to I/O (input/output) control signal.

3. The testing device as claimed in claim 1, wherein the VGA-AGP switching circuit comprises a control circuit for enabling the signal auto-switching circuit.

4. The testing device as claimed in claim 3, wherein the signal auto-switching circuit is coupled to the AGP display test, the VGA display test and the control circuit respectively.

5. The testing device as claimed in claim 4, wherein an AGP-RST trigger signal is outputted to the AGP display test, a control signal from the testing signal converting module is outputted to the control circuit.

6. The testing device as claimed in claim 1, wherein the first testing circuit comprises three branches: a branch for detecting the chassis ID, a branch for detecting the HDD LED and a branch for the power LED and a front device coupled to the three branches.

7. The testing device as claimed in claim 6, wherein the branch for detecting the chassis ID comprises a chassis ID connector, a first control circuit and first register, the first control circuit is coupled to the chassis ID connector and the first register, respectively.

8. The testing device as claimed in claim 6, wherein the branch for detecting the HDD LED comprises a second control circuit and a first voltage detecting circuit; the second control circuit is coupled to the HDD LED and the first voltage detecting circuit.

9. The testing device as claimed in claim 6, wherein the branch for detecting the power LED comprises a second register, a comparing control circuit, a second voltage detecting circuit and an I/O control port; the power LED is coupled to the second register and the comparing control circuit, the second voltage detecting circuit is coupled to the comparing control circuit and the I/O control port.

10. The testing device as claimed in claim 1, wherein the second testing circuit comprises an untested signal resource and a fourth testing circuit.

11. The testing device as claimed in claim 10, wherein a first input signal from the testing signal converting module is outputted to the line out/line in circuit and the mic-line in circuit, a second input signal from the testing signal converting module is outputted to the cd-in-speaker circuit, the untested audio signal resource is coupled to the line out/line in circuit, the mic-line in circuit and the cd-in-speaker circuit, and all of the line out/line in circuit, the mic-line in circuit and the cd-in-speaker circuit output signals to the fourth testing circuit.

12. The testing device as claimed in claim 1, wherein the battery testing circuit comprises a control circuit and a detection circuit.

13. The testing device as claimed in claim 11, wherein a control signal from the testing signal converting module is outputted to the control circuit of the battery testing circuit, the control circuit of the battery testing circuit and the control circuit of battery normal voltage are both coupled to the comparator circuit.

14. The testing device as claimed in claim 1, further comprising a serial port testing circuit, a network card testing circuit and a switching port for computer connectors.

15. A testing device for testing a printed circuit board, comprising:

a probing fixing board comprising a plurality of probes used to electrically contact predetermined portions of said printed circuit board and retrieve a current electrical state of said portions of said printed circuit board;

a testing board comprising a plurality of testing circuits used to generate test results of said portions of said printed circuit board respectively and correspondingly based on said current electrical state, and a testing signal converting module used to electrically connect to each of said plurality of probes of said probing fixing board so as to integrally retrieve said current electrical state of said portion of said printed circuit board exclusively from said plurality of probes of said probing fixing board, said testing signal converting module subsequently generating at least two kinds of compatible signals to corresponding ones of said plurality of testing circuits in order for creating at least two of said test results corresponding to at least two of said portions of said printed circuit board; and a plurality of testing implements electrically connecting to said plurality of testing circuits so as to display said test results from said plurality of testing circuits.

16. The testing device as claimed in claim 15, wherein said plurality of testing circuits comprises a switching circuit for switching a VGA test to an AGP test via an auto-switching circuit.

17. The testing device as claimed in claim 15, wherein one of said plurality of testing circuits is used for detecting chassis ID, the state of HDD LED as well as power LED.

18. The testing device as claimed in claim 15, wherein one of said plurality of testing circuits is used for testing audio quality, and comprises a line out/line in circuit for a headphone test, a mic-line in circuit for a microphone test and a cd-in-speaker circuit for a cd-speaker test.

19. The testing device as claimed in claim 15, wherein one of said plurality of testing circuits is used for comparing the voltage of a battery of the printed circuit board with a normal voltage, and comprises a control circuit of battery normal voltage and a comparator coupled to the control circuit of battery normal voltage.

20. A method for testing a printed circuit board comprising:

providing an integrally-installed probing testing board with a plurality of probes for electrically contacting all test-necessary portions of said printed circuit board to retrieve a current electrical state of said portions of said printed circuit board;

electrically connecting said plurality of probes to an integral testing board with a plurality of testing circuits used for generating test results of said portions of said printed circuit board based on said current electrical state of said portions of said printed circuit board; and converting integrally electrical signals from said plurality of probes for at least two of said plurality of testing circuits to generate at least two test results corresponding to at least two of said portions of said printed circuit board.

21. The method as claimed in claim 20, wherein said signals are converted for a VGA-AGP switching circuit, a front panel testing circuit, an audio testing circuit and a battery testing circuit in said converting step.

22. The method as claimed in claim 20, further comprising the step of generating said test results by means of circuits integrally formed on said testing board with said plurality of testing circuits for network card testing and serial port testing.

* * * * *